US000001856H

United States Statutory Invention Registration [19]

[11] Reg. Number: H1,856

Baldasaro et al.

[45] Published: Sep. 5, 2000

[54] LAPPED SUBSTRATE FOR ENHANCED BACKSURFACE REFLECTIVITY IN A THERMOPHOTOVOLTAIC ENERGY CONVERSION SYSTEM

[75] Inventors: Paul F Baldasaro; Edward J Brown; Greg W Charache; David M DePoy, all of Clifton Park, N.Y.

[73] Assignee: The United States of America as represented by the United States Department of Energy, Washington, D.C.

[21] Appl. No.: 08/740,517

[22] Filed: Oct. 30, 1996

[51] Int. Cl.[7] ..... H01L 31/00; H01L 21/00

[52] U.S. Cl. ..... 136/258; 136/262; 438/69; 438/72

[58] Field of Search ..... 136/253, 256, 136/262; 216/52, 53, 88, 89; 438/57, 64, 69, 72, 690, 691, 692; 451/41

[56] References Cited

U.S. PATENT DOCUMENTS

| | | | |
|---|---|---|---|
| 3,953,876 | 4/1976 | Sirtl et al. | 136/256 |
| 3,988,167 | 10/1976 | Kressel et al. | 136/256 |
| 4,082,570 | 4/1978 | House et al. | 136/246 |
| 4,179,308 | 12/1979 | Olsen et al. | 136/262 |
| 4,673,770 | 6/1987 | Mandelkorn | 136/259 |
| 4,764,104 | 8/1988 | Nelson | 431/100 |
| 4,824,489 | 4/1989 | Cogan et al. | 136/256 |
| 5,407,491 | 4/1995 | Freundlich et al. | 136/249 |

OTHER PUBLICATIONS

Swanson, R.M. "Silicon Photovoltaic Cells in TPV Conversion"; EPRI Project 790–2; Interim Report ER–1272, Dec. 1979.

Kostlin, H. et al. "Thin–film reflection Filters", Phillips Tech. Rev., 41, 225 (1983).

*Primary Examiner*—Charles T. Jordan
*Assistant Examiner*—Aileen J. Baker
*Attorney, Agent, or Firm*—Virginia B. Caress; William R. Moser; Paul A. Gottlieb

[57] ABSTRACT

A method for fabricating a thermophotovoltaic energy conversion cell including a thin semiconductor wafer substrate (10) having a thickness (β) calculated to decrease the free carrier absorption on a heavily doped substrate; wherein the top surface of the semiconductor wafer substrate is provided with a thermophotovoltaic device (11), a metallized grid (12) and optionally an antireflective (AR) overcoating; and, the bottom surface (10') of the semiconductor wafer substrate (10) is provided with a highly reflecting coating which may comprise a metal coating (14) or a combined dielectric/metal coating (17).

26 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

LAPPED SUBSTRATE FOR ENHANCED BACKSURFACE REFLECTIVITY IN A THERMOPHOTOVOLTAIC ENERGY CONVERSION SYSTEM

The United States Government has rights in this invention pursuant to Contract No. DE-AC12-76-SN00052 awarded by the U.S. Department of Energy.

TECHNICAL FIELD

The present invention relates to the field of thermophotovoltaic (TPV) direct energy conversion in general, and in particular this invention embodies a novel method to improve conversion efficiency using back surface reflection as a spectral control technique.

BACKGROUND ART

Thermophotovoltaic (TPV) devices convert thermal energy to electric power using the same principle of operation as solar cells. In particular, a heat source radiatively emits photons which are incident on a semiconductor TPV cell. Photons with an energy greater than the semiconductor bandgap ($E_g$) excite electrons from the valence band to the conduction band (interband transition). The resultant electron-hole-pairs (ehp) are then collected by metal contacts and can power electrical loads. Photons with energy less than $E_g$ are parasitically absorbed as heat. In order to increase the efficiency of a TPV energy system some form of spectral control is employed to reflect the photons with energy below $E_g$ back to the emitter before they are parasitically absorbed. This invention proposes a TPV design concept that uniquely integrates the spectral control and cell into a single design.

Previous researchers have attempted to improve TPV conversion efficiency through spectral control by three different methods. In the first method researchers modified the emission spectrum of the thermal radiator in an attempt to suppress emission of below-bandgap energy. Several techniques have been tried including surface texturing and rare earth oxide coating. Nelson, U.S. Pat. No. 4,764,104 provides one example.

In the second method, researchers position selective filters in front of the TPV cell. These filters transmit most of the above-bandgap energy but reflect below-bandgap energy back to the radiator for "recycling". A publication by H. K östlin and G. Frank; "Thin-film reflection Filters". Phillips Tech. Rev. 41 1983/84, No. 7/8 describes this technology.

In the third method, a highly reflective coating is applied to the back of the TPV cell. Most of the above-bandgap energy is absorbed in the active region of the cell while most of the below-bandgap energy passes through the cell reaching the back surface. There it is reflected and returned to the radiator after passing through the cell a second time. Another publication by R. M. Swanson; "Silicon Photovoltaic Cells in TPV Conversion"; EPRI Project 790-2; Interim Report ER-1272, December 1979 provides an example of this technique. One critical issue associated with this approach is the amount of below-bandgap energy parasitically absorbed during transit through the cell. This invention addresses that issue.

DISCLOSURE OF THE INVENTION

For this TPV design a backside surface reflector is used for spectral control. However, in order to reduce free carrier absorption of the below bandgap photons, the wafer substrate is thinned using mechanical polishing techniques before the backside reflector is applied.

To a first order approximation, the semiconductor TPV cell is transparent to photons with energies below $E_g$ because it is energetically impossible for these photons to excite electrons from the valence band to the conduction band. However, there is a second order effect in which electrons in the conduction band and holes in the valence band are excited to higher energy levels within their respective bands. This is referred to as free-carrier absorptions. This process is characterized by the free carrier absorption coefficient ($\alpha_F$). Generally, $\alpha_F$ is proportional to the semiconductor doping level and the square of wavelength. A typical value of $\alpha_F$ in GaSb (doped to $5\times10^{16}cm^{-3}$) is 3 $mc^{-1}$ @ 9 $\mu$m. Thus, in order to decrease the free carrier absorption on a heavily doped substrate, a thin wafer is required.

One technique that has been used to thin wafers extensively in compound semiconductor microwave device fabrication is wafer lapping. This process consists of mounting the wafer to a mechanically stable support and mechanically grinding away the backside of the wafer using sequentially finer size grits. Finally a chemical etch is used to remove residual damage and to form a highly specular surface. Using these chemical-mechanical polishing techniques, GaAs wafers are routinely thinned to 4 mils (100 $\mu$m).

Once the wafer substrate has been lapped to a sufficiently small thickness, the integration of a highly reflecting back electrical contact is required. This may consist of a highly reflective metal such as silver, gold, or copper. Unfortunately, the as deposited metal/semiconductor interface may not form an adequate ohmic contact and a sinter step may degrade the reflectivity of the substrate. An alternative to an entirely reflecting back surface is the use of a combination dielectric/metal reflector as described herein.

BRIEF DESCRIPTION OF THE DRAWINGS

These and other attributes of the invention will become more clear upon a thorough study of the following description of the best mode for carrying out the invention, particularly when reviewed in conjunction with the drawings, wherein.

BEST MODE FOR CARRYING OUT THE INVENTION

The method that forms the basis of the present invention involves using back surface reflection as a spectral control technique in thermophotovoltaic (TPV) energy systems wherein the spectral control and the cell are integrated into a single design.

Figure 1:
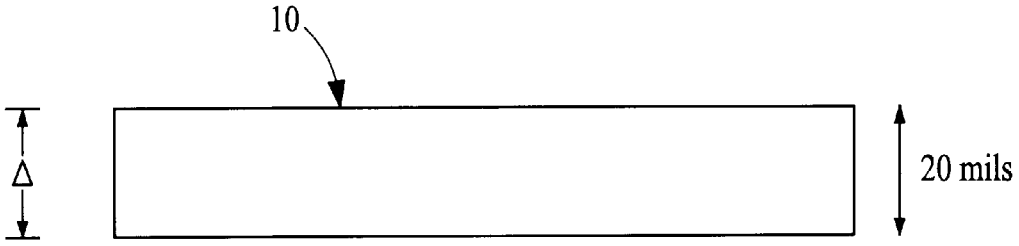
FIG. 1 is a cross-sectional view of a typical semiconductor wafer employed in conjunction with the teaching of this invention.
Figure 2:
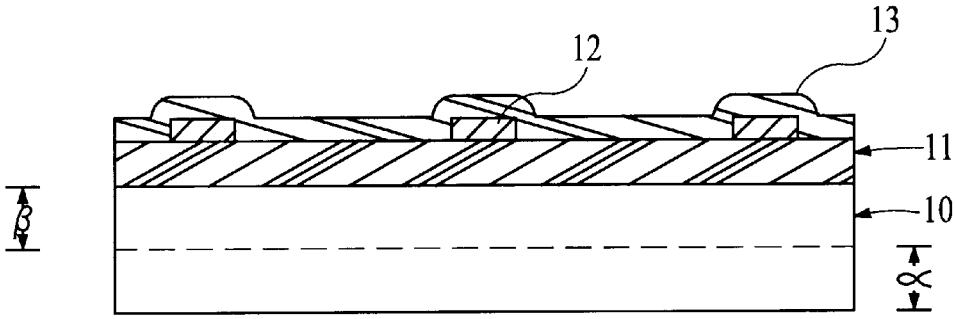
FIG. 2 is a cross-sectional view of the first and second phases in the production of both the metal and dielectric/metal reflectors of this invention.
Figure 3:
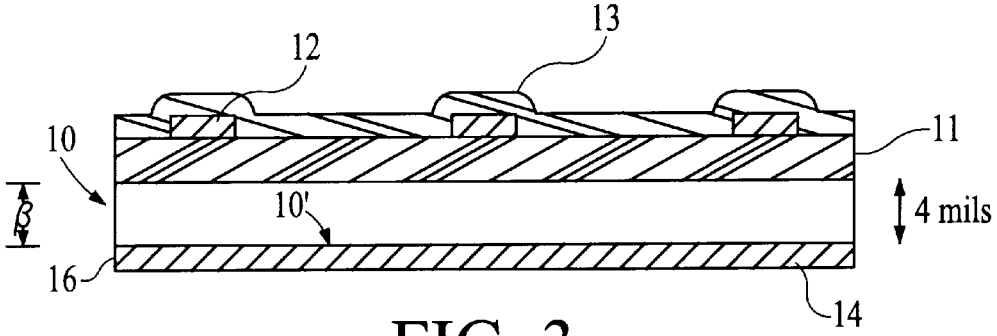
FIG. 3 is a cross-sectional view of the third phase in the production of a metal reflector.
Figure 4:
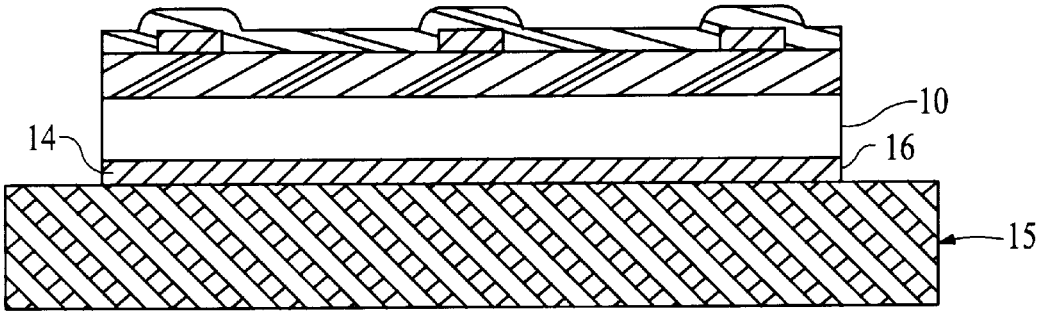
FIG. 4 is a cross-sectional view of the finished metal reflector mounted on a module substrate.
Figure 5:
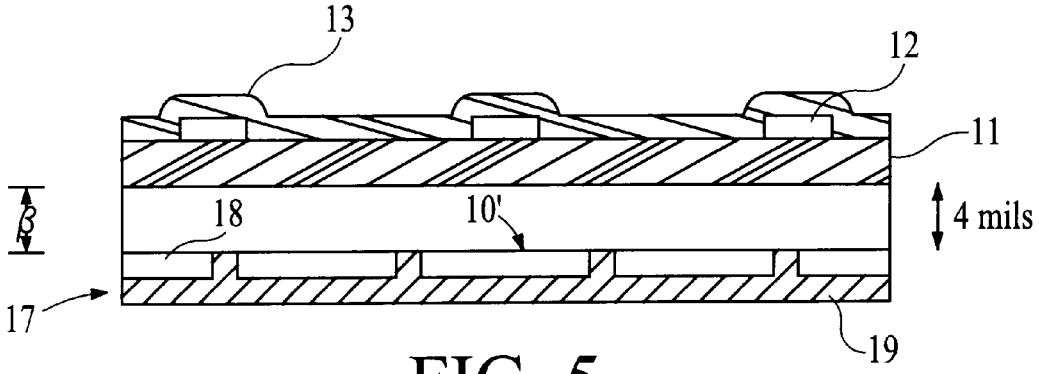
FIG. 5 is a cross-sectional view of the third phase in the production of a dielectric/metal reflector.
Figure 6:
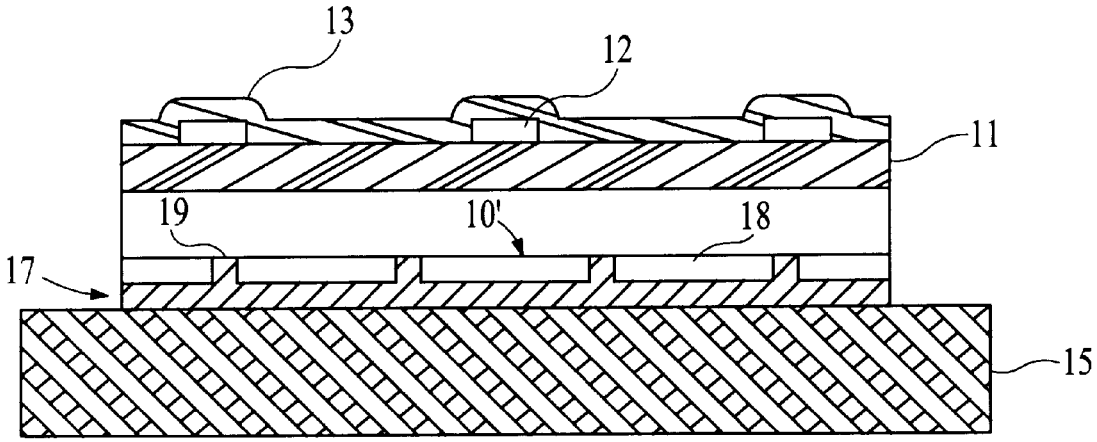
FIG. 6 is a cross-sectional view of the finished dielectric/metal reflector mounted on a module substrate.

As shown in FIGS. 1 and 2, the same preliminary steps are employed in the fabrication of both versions of the finished product of this invention and those steps will now be described in seriatim fashion.

The starting point in the fabrication process begins with a semiconductor wafer substrate (10) fabricated from any n-type substrate material and having an initial thickness (Δ) of approximately 20 mils. The next step in the fabrication is illustrated in FIG. 2 wherein the top surface of the wafer substrate is provided with a thermophotovoltaic device (11) a metallized grid (12) and optionally an antireflective (AR) overcoating (13).

Examples of some of the materials that may be used for the various components are as follows: TPV substrate GaSb, InP, InAs; TPV device InGaAsSb, InGaAs, InGaSb, InAsPSb; dielectric materials silicon dioxide, silicon nitride, silicon monoxide, used in combination with metals gold, silver, copper, platinum; and metallized grid Au. It should also be noted that this list of materials is for illustration purposes only and is not intended to represent either a comprehensive or an exclusive listing of suitable materials.

At this juncture, the wafer substrate of the partially finished compound semiconductor microwave device is first subjected to a lapping operation which may involve a mechanical grinding process using sequentially finer grits to lap away a predetermined thickness (α) from the wafer substrate (10) until the wafer substrate (10) has a desired thickness (β) in the range of 3–5 mils. Then the lapped wafer substrate (10) is subjected to a chemical etching step to remove residual damage to the bottom of the lapped wafer substrate (10) and to form a highly specular bottom surface (10') .

The next step is to integrate a highly reflective back electrical contact on the bottom surface (10') of the lapped wafer substrate (10), and at this point the two methods of fabrication diverge. In the first method of fabrication illustrated in FIGS. 1 through 4, a highly reflective metal such as silver, gold, copper or platinum may be vapor deposited on the bottom surface (10') of the wafer substrate to form a backside ohmic contact that serves as a below bandgap metal reflector (14) which is then mounted on a module substrate (15) to produce the finished device.

Under some circumstances, the as-deposited metal/semiconductor interface as at (16) may not form an adequate ohmic contact and a sinter step may degrade the reflectivity of the wafer substrate. As a consequence, an alternative backside reflector (17) has been developed that may also be alloyed to form a lower resistance ohmic contact while still maintaining a high reflectivity.

In this second method of fabrication illustrated in FIGS, 1, 2, 5 and 6, a combination dielectric/metal reflector (17) may be formed on the bottom surface (10') of the lapped and etched wafer substrate (10). The combined dielectric/metal reflector may be formed by chemical vapor deposition of the dielectric (18) on the bottom surface of the lapped and etched wafer substrate (10), followed by photolithography to pattern a photoresist film on the dielectric layer (18). This is followed by chemical etching of the dielectric, then vapor deposition of the metal contact/reflector (19), and an ohmic contact sinter and anneal step, followed by mounting the dielectric/metal reflector to a module substrate (15) to produce the alternate version of the preferred device.

An alternate lapping operation envisioned by this invention would involve a chemical etching process wherein a given thickness (α) of the wafer substrate (10) would be chemically removed to produce a wafer substrate having the desired thickness (β) preferably 3–5 mils. One example of a chemical etching solution is an $HCL:H_3PO_4$ 1:1 solution that is used to etch InP.

By now it should be appreciated that the related methods and finished products produced by this invention offer significant advantages over the conventional compound semiconductor TPV cell by combining the spectral control and the TPV cell into a unified structure. It improves the overall efficiency of the TPV cell due to high reflection of below-bandgap photons and reflects low energy photons over a broader range of energies than the state of the art interface or plasma filters.

Furthermore, it represents a more readily manufacturable technology over other ultra-thin cell approaches. It is applicable to all TPV material systems and potentially provides a "photon-recycling" mechanism that could lead to decreased dark current, higher effective minority carrier lifetimes, quantum efficiency and open circuit voltages.

Having thereby described the subject matter of the present invention, it should be apparent that many substitutions, modifications and variations of the invention are possible in light of the above teachings. It is therefore to be understood that the invention as taught and described herein is only to be limited to the extent of the breadth and scope of the appended claims.

What is claimed is:

1. A method of fabricating a thermophotovoltaic energy conversion cell in order to provide spectral control and improve efficiency, wherein the method comprises the following steps:

a) forming a thermophotovoltaic device on the top surface of a doped semiconductor wafer substrate followed by the formation of a metallized grid on top of said thermophotovoltaic device;

wherein said thermophotovoltaic device comprises material selected from InGaAsSb, InGaAs, InGaSb, and InAsPSb, and wherein said doped semiconductor wafer substrate comprises material selected from GaSb, InP, and InAs, b) subjecting said doped semiconductor wafer substrate, having an initial thickness "Δ", to a lapping operation to remove an excess thickness "β" so that said substrate has a finished thickness "α", wherein "β" is 3 to 5 mils, and c) forming a reflecting coating on the bottom surface of said substrate.

2. The method as in claim 1 wherein step b) precedes step a).

3. The method as in claim 1; wherein, said lapping operation involves a mechanical lapping process.

4. The method as in claim 3; wherein, said mechanical lapping process is followed by a chemical etching process.

5. The method as in claim 1; wherein, said lapping operation involves a chemical etching process.

6. The method as in claim 1; wherein, step c) includes the vapor deposition of a reflecting metal coating on the bottom surface of said semiconductor wafer substrate.

7. The method as in claim 1; wherein, the reflecting coating comprises a combination dielectric/metal reflector.

8. The method as in claim 1 further including the step of:

d) depositing an antireflective coating on top of both the thermophotovoltaic device and the metallized grid.

9. The method as in claim 7; wherein, the combination dielectric/metal reflector is formed by the chemical vapor deposition of a dielectric layer on the bottom surface of the semiconductor wafer substrate, followed by utilizing photolithography to pattern a photoresist film on the dielectric, then the chemical etching of the dielectric layer and the vapor deposition of a metal contact reflector onto the etched dielectric layer.

10. The method as in claim 6 further comprising the step of:

e) operatively engaging the bottom surface of the reflecting coating to a module substrate.

11. The method as in claim 2; wherein, said lapping operation involves a mechanical lapping process.

12. The method as in claim 2; wherein, said lapping operation involves a chemical etching process.

13. The method as in claim 2; wherein, step c) includes the vapor deposition of a reflecting metal coating on the bottom surface of said semiconductor wafer substrate.

14. The method as in claim 2; wherein, the reflecting coating comprises a combination dielectric/metal reflector.

15. The method as in claim 7 further comprising the step of:

e) operatively engaging the bottom surface of the reflecting coating to a module substrate.

16. A thermophotovoltaic energy cell comprising:

a thin semiconductor wafer substrate having a top surface, a bottom surface, and a selected thickness "β"; wherein "β" is 3 to 5 mils, said thickness being optimized to decrease the free carrier absorption on a doped substrate;

a thermophotovoltaic device on the top surface of said semiconductor wafer substrate, a metallized grid on said thermophotovoltaic layer; and, a reflecting layer on the bottom of said semiconductor wafer substrate.

17. The thermophotovoltaic energy cell as in claim 16; wherein, said reflecting layer comprises a highly reflective metal.

18. The thermophotovoltaic energy cell as in claim 16; wherein, said reflecting layer comprises a combination dielectric/metal reflector.

19. The thermophotovoltaic energy cell as in claim 16 further including:

f) an antireflective overcoating layer on both said metallized grid and on said thermophotovoltaic device.

20. The thermophotovoltaic energy cell as in claim 16; wherein, said reflective metal is chosen from a class including silver, gold, copper and platinum.

21. The thermophotovoltaic energy cell as in claim 16; wherein the substrate is fabricated from a class of materials which includes GaSb, InP and InAs.

22. The thermophotovoltaic energy cell as in claim 16; wherein the thermophotovoltaic device is fabricated from a class of materials which includes InGaAsSb InGaAs, InGaSb, InAsPSb.

23. The thermophotovoltaic energy cell as in claim 18; wherein, the combination dielectric/metal reflector is fabricated from a class of dielectric materials which includes silicon dioxide, silicon nitride, silicon monoxide.

24. The thermophotovoltaic energy cell as in claim 23; wherein, the combination dielectric/metal reflector is fabricated from a class of metals which includes gold, silver, copper, platinum.

25. The method as in claim 11; wherein, said mechanical lapping process is followed by a chemical etching process.

26. A thermophotovoltaic energy cell made by the process of claim 1, said cell comprising:

a thin heavily doped semiconductor wafer substrate having a top surface, a bottom surface, and a selected finished thickness "β"; wherein "β" is 3 to 5 mils;

a thermophotovoltaic device on the top surface of said semiconductor wafer substrate, a metallized grid on top of said thermophotovoltaic device; and, a reflecting coating on the bottom surface of said semiconductor wafer substrate.

* * * * *